US012456670B2

(12) United States Patent
Yang et al.

(10) Patent No.: US 12,456,670 B2
(45) Date of Patent: Oct. 28, 2025

(54) ELECTRONIC DEVICE

(71) Applicant: InnoLux Corporation, Miao-Li County (TW)

(72) Inventors: Chia-Lin Yang, Miao-Li County (TW); Sheng-Nan Chen, Miao-Li County (TW); Kuang-Ming Fan, Miao-Li County (TW); Kuan-Feng Lee, Miao-Li County (TW); Jui-Jen Yueh, Miao-Li County (TW); Chin-Ming Huang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 514 days.

(21) Appl. No.: 17/955,557

(22) Filed: Sep. 29, 2022

(65) Prior Publication Data

US 2024/0014116 A1    Jan. 11, 2024

(30) Foreign Application Priority Data

Jul. 8, 2022    (CN) .......................... 202210806204.9

(51) Int. Cl.
*H01L 23/498*    (2006.01)
*H01L 23/00*    (2006.01)
(Continued)

(52) U.S. Cl.
CPC .... *H01L 23/49838* (2013.01); *H01L 23/3677* (2013.01); *H01L 23/49816* (2013.01);
(Continued)

(58) Field of Classification Search
CPC .......... H01L 23/49838; H01L 23/3677; H01L 23/49816; H01L 23/5386; H01L 24/08;
(Continued)

(56) References Cited

U.S. PATENT DOCUMENTS 9,543,373 B2    1/2017  Liang
2015/0001717 A1    1/2015  Karhade
(Continued)

FOREIGN PATENT DOCUMENTS

CN        104253115 B    9/2018
CN        113990759 A    1/2022
(Continued)

*Primary Examiner* — Fernando L Toledo
*Assistant Examiner* — Neil R Prasad
(74) *Attorney, Agent, or Firm* — Winston Hsu

(57) ABSTRACT

An electronic device includes an electronic unit, a circuit layer and a bonding pad. The electronic unit includes a chip, an insulating layer and a first conductor layer. The insulating layer is disposed on the chip, the insulating layer includes a first opening, and the first conductor layer is disposed in the first opening. The circuit layer is disposed corresponding to the electronic unit, and the circuit layer includes a second opening and a second conductor layer disposed in the second opening. The bonding pad is in contact with the second conductor layer, and the bonding pad is electrically connected to electronic unit. The first conductor layer has a first height, the second conductor layer has a second height, and a ratio of the first height to the second height is greater than or equal to 0.1 and less than or equal to 0.9.

18 Claims, 9 Drawing Sheets

(51) Int. Cl.
  *H01L 23/367* (2006.01)
  *H01L 23/538* (2006.01)
(52) U.S. Cl.
  CPC .......... *H01L 23/5386* (2013.01); *H01L 24/08* (2013.01); *H01L 24/09* (2013.01); *H01L 2224/0801* (2013.01); *H01L 2224/08225* (2013.01); *H01L 2224/0903* (2013.01); *H01L 2924/30101* (2013.01)
(58) Field of Classification Search
  CPC ............. H01L 24/09; H01L 2224/0801; H01L 2224/08225; H01L 2224/0903; H01L 2924/30101
  See application file for complete search history.

(56) References Cited

U.S. PATENT DOCUMENTS

| | | | |
|---|---|---|---|
| 2018/0261557 A1* | 9/2018 | Yu ........................... | H01L 25/105 |
| 2020/0211967 A1* | 7/2020 | Nakano ............. | H01L 23/53261 |
| 2021/0035907 A1* | 2/2021 | Chen ........................ | H01L 24/13 |
| 2021/0134611 A1* | 5/2021 | Liu ........................... | H01L 25/50 |
| 2023/0087810 A1* | 3/2023 | Ecton ................ | H01L 23/49811 257/773 |

FOREIGN PATENT DOCUMENTS

| | | | |
|---|---|---|---|
| TW | I682692 B | 1/2020 | |
| TW | 202129885 A | 8/2021 | |

* cited by examiner

ELECTRONIC DEVICE

BACKGROUND OF THE DISCLOSURE

1. Field of the Disclosure

The present disclosure relates to an electronic device, and more particularly to an electronic device including a semiconductor package structure.

2. Description of the Prior Art

Recently, with electronic devices have become smaller and smaller and more components need to be integrated into the electronic devices, the design and quality of the circuit layer between the components will affect the performance of the electronic devices. In the structure of the circuit layer, the effect of heat dissipation affects the performance of the electronic device. Therefore, how to provide good signal transmission effect and good heat dissipation effect at the same time is an issue that needs further improvement.

SUMMARY OF THE DISCLOSURE

To solve the above problems, it is an object of the present disclosure to provide an electronic device.

An embodiment of the present disclosure provides an electronic device, which includes an electronic unit, a circuit layer and a bonding pad. The electronic unit includes a chip, an insulating layer and a first conductor layer. The insulating layer is disposed on the chip, the insulating layer includes a first opening, and the first conductor layer is disposed in the first opening. The circuit layer is disposed corresponding to the electronic unit, and the circuit layer includes a second opening and a second conductor layer disposed in the second opening. The bonding pad is in contact with the second conductor layer, and the bonding pad is electrically connected to electronic unit. The first conductor layer has a first height, the second conductor layer has a second height, and a ratio of the first height to the second height is greater than or equal to 0.1 and less than or equal to 0.9.

These and other objectives of the present disclosure will no doubt become obvious to those of ordinary skill in the art after reading the following detailed description of the embodiment that is illustrated in the various figures and drawings.

DETAILED DESCRIPTION

Figure 1:
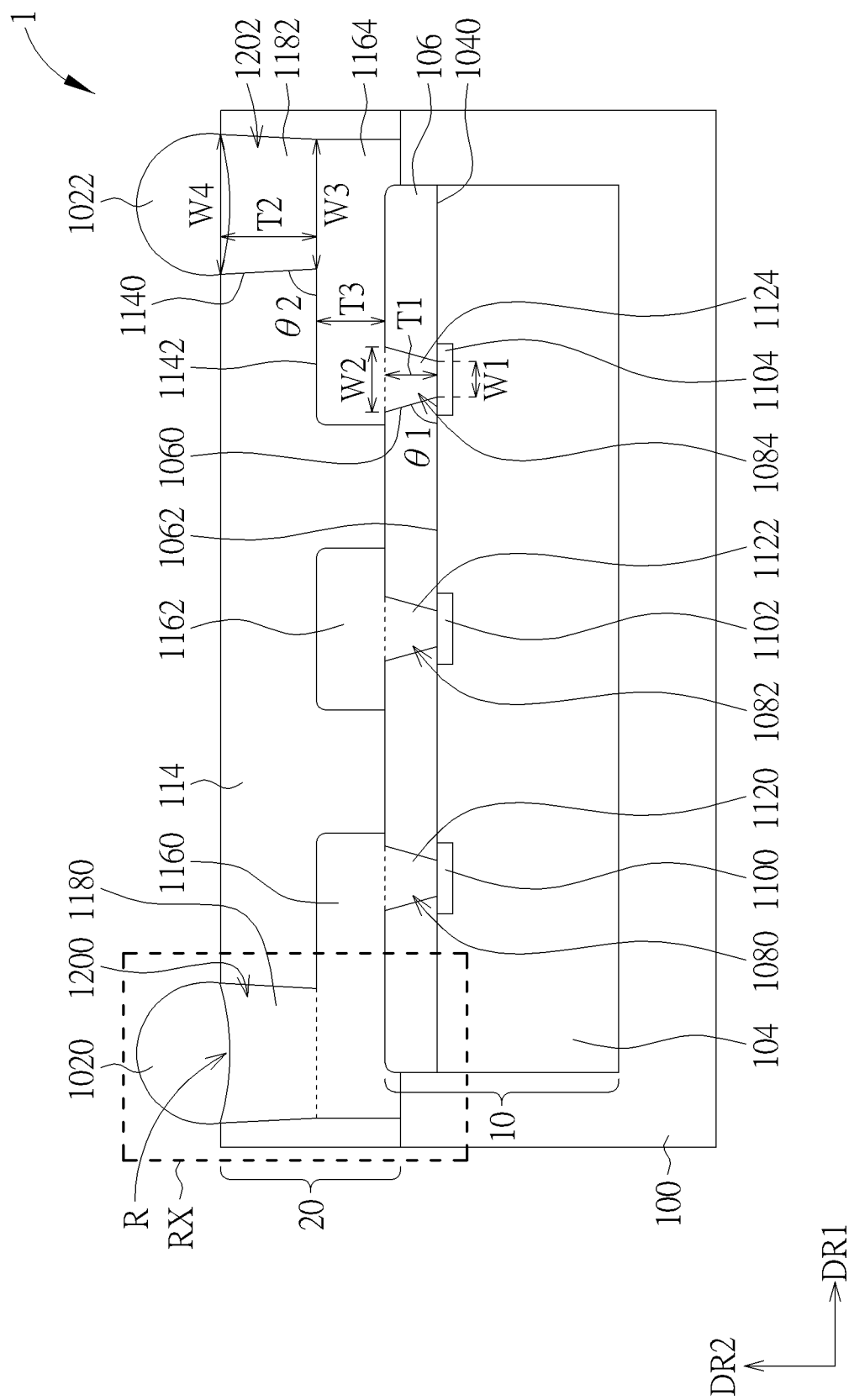
FIG. 1 is a schematic cross-sectional diagram illustrating an electronic device according to a first embodiment of the present disclosure.

The contents of the present disclosure will be described in detail with reference to specific embodiments and drawings.

It is noted that, for purposes of illustrative clarity and being easily understood by the readers, the following drawings may be simplified schematic diagrams of electronic devices or a portion of the electronic devices, and components therein may not be drawn to scale. The numbers and dimensions of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this disclosure does not intend to distinguish between components that differ in name but not function. In the following description and claims, the terms "comprise", "include" and "have" are used in an open-ended fashion, so they should be interpreted as "including but not limited to . . . ".

It should be understood that when a component or layer is referred to as being "on" or "disposed on" another component or layer, or "connected to" another component or layer, it may be directly on the another component or layer or directly connected to the another component or layer, or there may be an interposed component or layer between the two components or layers (indirect case). Conversely, when a component is referred to as being "directly on" another component or layer, "directly disposed on" another component or layer, or "directly connected to" another component or layer, there are no interposed components or layers between the two components or layers. In addition, the arrangement relationship between different components may be explained by the content of the drawings.

An electrical connection may be a direct connection or an indirect connection. When two elements are electrically connected, the electrical signals may be transmitted by direct contact, and there are no other elements presented between the two elements. When two elements are electrically connected, the electrical signals may be transmitted through the intermediate element bridging the two elements. The electrical connection may also be referred to as coupling.

In addition, it should be understood that although the terms "first", "second", "third", etc. may be used herein to describe various components, these components should not be limited by these terms. These terms may be used to distinguish different components in the specification. The same terms may not be used in the claims, and the components in the claims may be described by the terms "first", "second", "third", etc. according to the order of the components presented in the claims. Thus, a first component discussed below may be termed as a second component in the claims without departing from the present disclosure.

According to the embodiments of the present disclosure, the width, thickness, height or area of each component, or the distance or spacing between components may be measured by using an optical microscopy (OM), a scanning electron microscope (SEM), a film thickness profile measuring instrument (α-step), an ellipsometer, or other suitable methods. In detail, according to some embodiments, a scanning electron microscope may be used to obtain a cross-sectional structure image containing the components to be measured, and to measure the width, thickness, height or area of each component, or the distance or spacing between the components, and to obtain the volume of the component through appropriate methods (such as integration).

Here, the terms "about", "equal to", "equal" or "the same", "substantially" or "approximately" usually mean within 20% of a given value, or within 10%, 5%, 3%, 2%, 1% or 0.5% of the given value.

It should be understood that according to the following embodiments, features of different embodiments may be replaced, recombined or mixed to constitute other embodiments without departing from the spirit of the present disclosure.

The electronic devices of the present disclosure may include, for example, a semiconductor package component, a display device, an antenna device, a touch display device, a curved display device, or a non-rectangular display device (or a free shaped display device), but not limited thereto. The electronic devices may be bendable or flexible electronic devices. The electronic devices may include tiled electronic devices, but not limited thereto. The electronic devices may include, for example, a light-emitting diode (LED), liquid crystal, fluorescence material, phosphor, other suitable display medium, or a combination thereof, but not limited thereto. The light-emitting diode may include, for example, an organic light emitting diode (OLED), an inorganic light emitting diode (LED), a mini light emitting diode (mini-LED), a micro light emitting diode (micro-LED) or quantum dots (QDs) light emitting diode (such as QLED, QDLED), other suitable light emitting diodes, or any combination thereof, but not limited thereto.

An electronic unit in the electronic device may include passive components and active components, such as integrated circuit, capacitor, resistor, inductor, diode, transistor, etc. The diode may include, for example, a light emitting diode or a photodiode. The sensing device may be, for example, a sensing device for detecting capacitance change, light, thermal energy or ultrasonic waves, but not limited thereto.

The antenna device may include, for example, a liquid crystal antenna or other kinds of antenna, but not limited thereto. The antenna device may include, for example, a tiled antenna device, but not limited thereto. It should be noted that the electronic devices of the present disclosure may be any combination of the aforementioned devices, but not limited thereto. In addition, the appearance of the electronic devices may be rectangular, circular, polygonal, a shape with curved edges, or other suitable shapes. The electronic devices may have peripheral systems such as a driving system, a control system, a light source system, a shelf system, etc., to support a display device, an antenna device or a tiled device. The following electronic devices take a semiconductor package component as an example, but not limited thereto.

A direction DR1 and a direction DR2 are shown in the following drawings. The direction DR2 may be a normal direction in an electronic device 1, but not limited thereto. The direction DR1 may be perpendicular to the direction DR2. The spatial relationship of the structure may be described according to the direction DR1 and the direction DR2 in the following drawings.

Please refer to FIG. 1, FIG. 1 is a schematic cross-sectional diagram illustrating an electronic device according to a first embodiment of the present disclosure. The electronic device 1 may include an encapsulation layer 100, an electronic unit 10, a circuit layer 20, a bonding pad 1020 and a bonding pad 1022, but not limited thereto. The electronic unit 10 may be disposed in the encapsulation layer 100, a top surface of the electronic unit 10 may be exposed or may not be covered by the encapsulation layer 100, and the electronic unit 10 can be connected with the circuit layer 20.

The encapsulation layer 100 may include an insulating material, the insulating material may include an organic insulating material, and the organic insulating material may include epoxy, epoxy molding compound (EMC), Ajinomoto Build-up Film (ABF), polyimide (PI) or other suitable organic insulating materials, but not limited thereto.

The encapsulation layer 100 surrounds the electronic unit 10. For example, in the cross-sectional diagram, the encapsulation layer 100 contacts at least the side surface of the electronic unit 10. The encapsulation layer 100 can reduce the influence of water and oxygen in the environment on the electronic unit 10, but not limited thereto.

The electronic unit 10 may include a chip 104, an insulating layer 106, a conductor layer 1120, a conductor layer 1122 and a conductor layer 1124, but not limited thereto. The chip 104 may include a capacitor, a resistor, an inductor, a diode chip or a semiconductor die, but not limited thereto. The diode chip may include an OLED, a mini-LED, a micro-LED, or a quantum dot light emitting diode (QLED or QDLED), but not limited thereto. The chip 104 may include a bonding pad 1100, a bonding pad 1102 and a bonding pad 1104, but the number of bonding pads of the chip 104 is not limited thereto.

The insulating layer 106 may be disposed on the chip 104. For example, the insulating layer 106 may be disposed on a surface 1040 of the chip 104 and expose the bonding pad 1100, the bonding pad 1102 and the bonding pad 1104. The insulating layer 106 may include an opening 1080, an opening 1082 and an opening 1084, but the number of the openings in the insulating layer 106 is not limited thereto. The opening 1080 may be disposed on the bonding pad 1100 and may expose a portion of the surface of the bonding pad 1100, the opening 1082 may be disposed on the bonding pad 1102 and may expose a portion of the surface of the bonding pad 1102, and the opening 1084 may be disposed on the bonding pad 1104 and may expose a portion of the surface of the bonding pad 1104.

The conductor layer 1120 may be disposed in the opening 1080 and on the bonding pad 1100, and the conductor layer 1120 may be electrically connected to the bonding pad 1100. The conductor layer 1122 may be disposed in the opening 1082 and on the bonding pad 1102, and the conductor layer 1122 may be electrically connected to the bonding pad 1102. The conductor layer 1124 may be disposed in the opening 1084 and on the bonding pad 1104, and the conductor layer 1124 may be electrically connected to the bonding pad 1104. In some embodiments, the conductor layer 1120 may be directly in contact with the bonding pad 1100, the conductor layer 1122 may be directly in contact with the bonding pad 1102, and the conductor layer 1124 may be directly in contact with the bonding pad 1104, but not limited thereto.

The conductor layers disposed in the openings in the insulating layer 106 may also be referred to as plugs or contacts. In some embodiments, the conductor layer 1120 and the bonding pad 1100 may provide a ground electric potential or a floating electric potential, but not limited thereto.

Taking the conductor layer 1124 as an example, the conductor layer 1124 has a top width W2 and a bottom width W1. The top width W2 may be greater than the bottom width W1, and a ratio of the bottom width W1 to the top width W2 may be greater than 0.3 and less than 0.8 ($0.3<W1/W2<0.8$). The bottom width W1 of the conductor layer 1124 may be the width of a bottom surface of the conductor layer 1124 being in contact with the bonding pad 1104. The top width W2 of the conductor layer 1124 may be the width of a top surface of the conductor layer 1124 being in contact with a conductor layer 1164 disposed on the conductor layer 1124.

In the present disclosure, the width can be measured along the direction DR1, but not limited thereto. In some embodiments, the bottom width W1 may be about 12 micrometers (μm), but not limited thereto.

In addition, the conductor layer 1124 has a height T1, and a ratio of the height T1 to the bottom width W1 may be greater than or equal to 1 and less than or equal to 4.5 ($1 \leq T1/W1 \leq 4.5$). The height T1 of the conductor layer 1124 can be the distance between the bottom surface and the top surface of the conductor layer 1124 in the direction DR2. In the present disclosure, the height can be measured along the direction DR2, but not limited thereto. The conductor layer 1120 and the conductor layer 1122 may also have the same features as the conductor layer 1124.

The circuit layer 20 may be disposed corresponding to the electronic unit 10 and disposed on the electronic unit 10. The circuit layer 20 may be, for example, a redistribution layer (RDL), but not limited thereto. The circuit layer 20 may include an insulating layer 114, a conductor layer 1160, a conductor layer 1162, the conductor layer 1164, a conductor layer 1180 and a conductor layer 1182, but not limited thereto. The circuit layer 20 may further include transistors, capacitors, resistors, antenna elements or other electronic components.

According to some embodiments, the electronic components may be electrically connected to the chip 140 through the conductor layers, but not limited thereto. The electronic component may further include a substrate and a circuit layer formed on the substrate, and the substrate may include a polyimide substrate, a glass substrate or a silicon substrate, but not limited thereto. The circuit layer may include active components and passive components, but not limited thereto.

The conductor layer 1160, the conductor layer 1162 and the conductor layer 1164 may be disposed in the insulating layer 114. The conductor layer 1160 may be disposed on the conductor layer 1120 and electrically connected to the conductor layer 1120, the conductor layer 1162 may be disposed on the conductor layer 1122 and electrically connected to the conductor layer 1122, and the conductor layer 1164 may be disposed on the conductor layer 1124 and electrically connected to the conductor layer 1124. In some embodiments, the conductor layer 1160 may be directly in contact with the conductor layer 1120, the conductor layer 1162 may be directly in contact with the conductor layer 1122, and the conductor layer 1164 may be directly in contact with the conductor layer 1124, but not limited thereto.

The conductor layer 1160, the conductor layer 1162 and the conductor layer 1164 may be extended along a direction perpendicular to the direction DR2 (such as the direction DR1), but not limited thereto. The conductor layers disposed in the insulating layer 106 and extending horizontally may also be referred to as conductor lines, but not limited thereto.

Taking the conductor layer 1164 as an example, the conductor layer 1164 has a height T3, and the height T3 may be greater than or equal to the height T1 ($T1 \leq T3$). The height T3 of the conductor layer 1164 may be the distance between a bottom surface and a top surface of the conductor layer 1164 in the direction DR2. For example, the bottom surface of the conductor layer 1164 may be in contact with the insulating layer 106, and the top surface of the conductor layer 1164 may be in contact with the insulating layer 114. The conductor layer 1160 and the conductor layer 1162 may also have the same features as the conductor layer 1164.

The circuit layer 20 may include an opening 1200 and an opening 1202 disposed in the insulating layer 114. The opening 1200 may be disposed on the conductor layer 1160 and may expose a portion of the surface of the conductor layer 1160, and the opening 1202 may be disposed on the conductor layer 1164 and may expose a portion of the surface of the conductor layer 1164.

The conductor layer 1180 may be disposed in the opening 1200, and the conductor layer 1180 may be electrically connected to the conductor layer 1160. The conductor layer 1182 may be disposed in the opening 1202, and the conductor layer 1182 may be electrically connected to the conductor layer 1164. In some embodiments, the conductor layer 1180 may be directly in contact with the conductor layer 1160, and the conductor layer 1182 may be directly in contact with the conductor layer 1164, but not limited thereto. According to some embodiments, the conductor layer 1180 and the conductor layer 1182 may be, for example, under bump metallization (UBM).

Therefore, the conductor layer 1160 may be disposed between the conductor layer 1120 and the conductor layer 1180, and the conductor layer 1160 may be electrically connected to the conductor layer 1120 and the conductor layer 1180. Also, the conductor layer 1164 may be disposed between the conductor layer 1124 and the conductor layer 1182, and the conductor layer 1164 may be electrically connected to the conductor layer 1124 and the conductor layer 1182.

Taking the conductor layer 1182 as an example, the conductor layer 1182 has a top width W4 and a bottom width W3, the top width W4 and the bottom width W3 may be approximately equal, and a ratio of the bottom width W3 to the top width W4 may be greater than 0.7 and less than 1.2 ($0.7 < W3/W4 < 1.2$). In some embodiments, the conductor layer 1182 may have a larger top width W4 since the conductor layer 1182 can be used to electrically connect the bonding pad 1022.

The bottom width W3 of the conductor layer 1182 may be the width of a bottom surface of the conductor layer 1182 being in contact with the lower conductor layer (such as the conductor layer 1164), and the top width W4 of the conductor layer 1182 may be the width of a top surface of the conductor layer 1182 being in contact with the bonding pad 1022 disposed on the conductor layer 1182.

According to some embodiments (such as FIG. 1 and FIG. 2), the bonding pad 1020 can be in contact with a top surface of the conductor layer 1180, the bonding pad 1022 can be in contact with a top surface of the conductor layer 1182, the top surface of the conductor layer 1180 and the top surface of the conductor layer 1182 may have recesses R, and a portion of the top surface of the conductor layer 1180 and a portion of the top surface of the conductor layer 1182 are lower than the top surface of the insulating layer 114. Through the design that the top surface of the conductor layer 1180 and the top surface of the conductor layer 1182 have recesses R, the accuracy of forming the bonding pads on the conductor layers can be improved, but not limited thereto.

According to some embodiments (such as FIG. 5 to FIG. 9), the top surface of the conductor layer 1180 and the top surface of the conductor layer 1182 may be flat surfaces without recesses, and the top surface of the insulating layer 114 and the top surfaces of the conductor layer 1180 and the conductor layer 1182 may substantially form a flat plane, but not limited thereto.

In some embodiments, the top width W4 may be greater than the bottom width W3, the bottom width W3 may be greater than the top width W2, and the top width W2 may be greater than the bottom width W1, but not limited thereto. In addition, the ratio of the bottom width W1 to the top width W2 of the conductor layer 1124 may be less than the ratio of the bottom width W3 to the top width W4 of the conductor layer 1182 ((W1/W2)<(W3/W4)).

The conductor layer 1182 has a height T2, and a ratio of the height T2 to the top width W4 may be greater than or equal to 0.2 and less than or equal to 0.5 (0.2≤T2/W4≤0.5). The height T2 of the conductor layer 1182 may be the maximum distance between the bottom surface and the top surface of the conductor layer 1182 in the direction DR2. The conductor layer 1180 may also have the same features as the conductor layer 1182.

The height T1 of the conductor layer 1124 may be less than the height T2 of the conductor layer 1182, and a ratio of the height T1 of the conductor layer 1124 to the height T2 of the conductor layer 1182 may be greater than or equal to 0.1 and less than or equal to 0.9 (0.1≤T1/T2≤0.9).

In some embodiments, the chip 104 may include a microcontroller (MCU), a central processing unit (CPU), a graphics processing unit, an application specific integrated circuit (ASIC), a field programmable gate array (FPGA) or combinations of the above, but not limited thereto.

When the density of the bonding pads in the chip is high, the height T1 may be greater than or equal to 2 micrometers and less than or equal to 4.5 micrometers, the height T2 may be greater than or equal to 5 micrometers and less than or equal to 20 micrometers, and the height T3 may be greater than or equal to 2 micrometers and less than or equal to 10 micrometers, but not limited thereto.

In some embodiments, the chip 104 may include a power management integrated circuit (PMIC), an analog integrated circuit or combinations of the above, but not limited thereto. When the density of the bonding pads in the chip is low, the height T1 may be greater than or equal to 5 micrometers and less than or equal to 20 micrometers, the height T2 may be greater than or equal to 25 micrometers and less than or equal to 60 micrometers, and the height T3 may be greater than or equal to 10 micrometers and less than or equal to 30 micrometers, but not limited thereto.

In addition, the conductive layer 1124 may include a sidewall 1060, the insulating layer 106 may include a bottom surface 1062, the sidewall 1060 may be connected to the bottom surface 1062, and an included angle θ1 may be included between the sidewall 1060 and the bottom surface 1062. The conductor layer 1182 may include a sidewall 1140, the conductor layer 1164 may include a top surface 1142, the sidewall 1140 may be connected to the top surface 1142, an included angle θ2 may be included between the sidewall 1140 and the top surface 1142, and the included angle θ1 may be less than the included angle θ2. The conductor layer 1120, the conductor layer 1122 and the conductor layer 1180 may also have the same features.

The bonding pad 1020 can be disposed on the conductor layer 1180, and the bonding pad 1020 can be electrically connected to the conductor layer 1180. The bonding pad 1022 can be disposed on the conductor layer 1182, and the bonding pad 1022 can be electrically connected to the conductor layer 1182. In some embodiments, the bonding pad 1020 can be in contact (e.g., directly contact) with the conductor layer 1180, and the bonding pad 1022 can be in contact (e.g., directly contact) with the conductor layer 1182, but not limited thereto.

In this embodiment, the height T1 of the conductor layer 1120, the conductor layer 1122 and the conductor layer 1124 may be less than the height T2 of the conductor layer 1180 and the conductor layer 1182. Since the height T1 is smaller, the heat generated by the chip 104 can be conducted to the external conductor layers (such as the conductor layer 1182) through a short distance and in a short time, and the heat accumulated in the conductor layers (such as the conductor layer 124) closest to the chip 104 can be reduced. Therefore, the heat dissipation effect of the electronic device 1 can be improved, and the probability that the performance of the electronic device 1 is lowered due to high temperature can be reduced.

The height T3 of the conductor layer 1160, the conductor layer 1162 and the conductor layer 1164 may be greater than the height T1 of the conductor layer 1120, the conductor layer 1122 and the conductor layer 1124. Therefore, the conductor layer 1160, the conductor layer 1162 and the conductor layer 1164 may have lower resistance. Since the conductor layer 1160, the conductor layer 1162 and the conductor layer 1164 can be used as laterally extending conductor lines, the lower resistance can improve the efficiency of signal transmission.

Since the conductor layer 1180 and the conductor layer 1182 can be used as the outermost conductive layers in the circuit layer 20 and can be used to electrically connect the bonding pads 1020 and 1022, the conductor layer 1180 and the conductor layer 1182 require better electrical connection ability. When the ratio of the bottom width W3 to the top width W4 of the conductor layer 1182 can be greater than 0.7 and less than 1.2, this ratio can be greater than the ratio of the bottom width W1 to the top width W2 of the conductor layer 1124, and the included angle θ1 can be less than the included angle θ2. Under this condition, the conductor layer 1182 can have a shape close to a straight cylinder and can have better signal transmission efficiency.

In some embodiments, the insulating layer 106 and the insulating layer 114 may include organic insulating materials, inorganic insulating materials or combinations of the above, but not limited thereto. The organic insulating material may include polyimide (PI), photosensitive polyimide (PSPI), epoxy, other suitable organic insulating materials or the combination of the above, but not limited thereto. The inorganic insulating material may include aluminum oxide, silicon dioxide, silicon nitride, silicon oxynitride, other suitable inorganic insulating materials or combinations of the above, but not limited thereto.

In some embodiments, the insulating layer 106 or the insulating layer 114 may include a filler, and the material of the filler may include aluminum oxide, silicon dioxide, silicon carbide, other suitable materials or combinations of the above, but not limited thereto. The particle size of the filler can be greater than or equal to 0.5 micrometers and less than or equal to 20 micrometers, but not limited thereto.

In some embodiments, the material of the bonding pad 1100, the bonding pad 1102 and the bonding pad 1104 may include aluminum or other suitable metals, but not limited thereto. The material of the bonding pad 1020 and the bonding pad 1022 may include tin, copper, nickel, silver, other suitable metals or combinations of the above, but not limited thereto.

Figure 2:
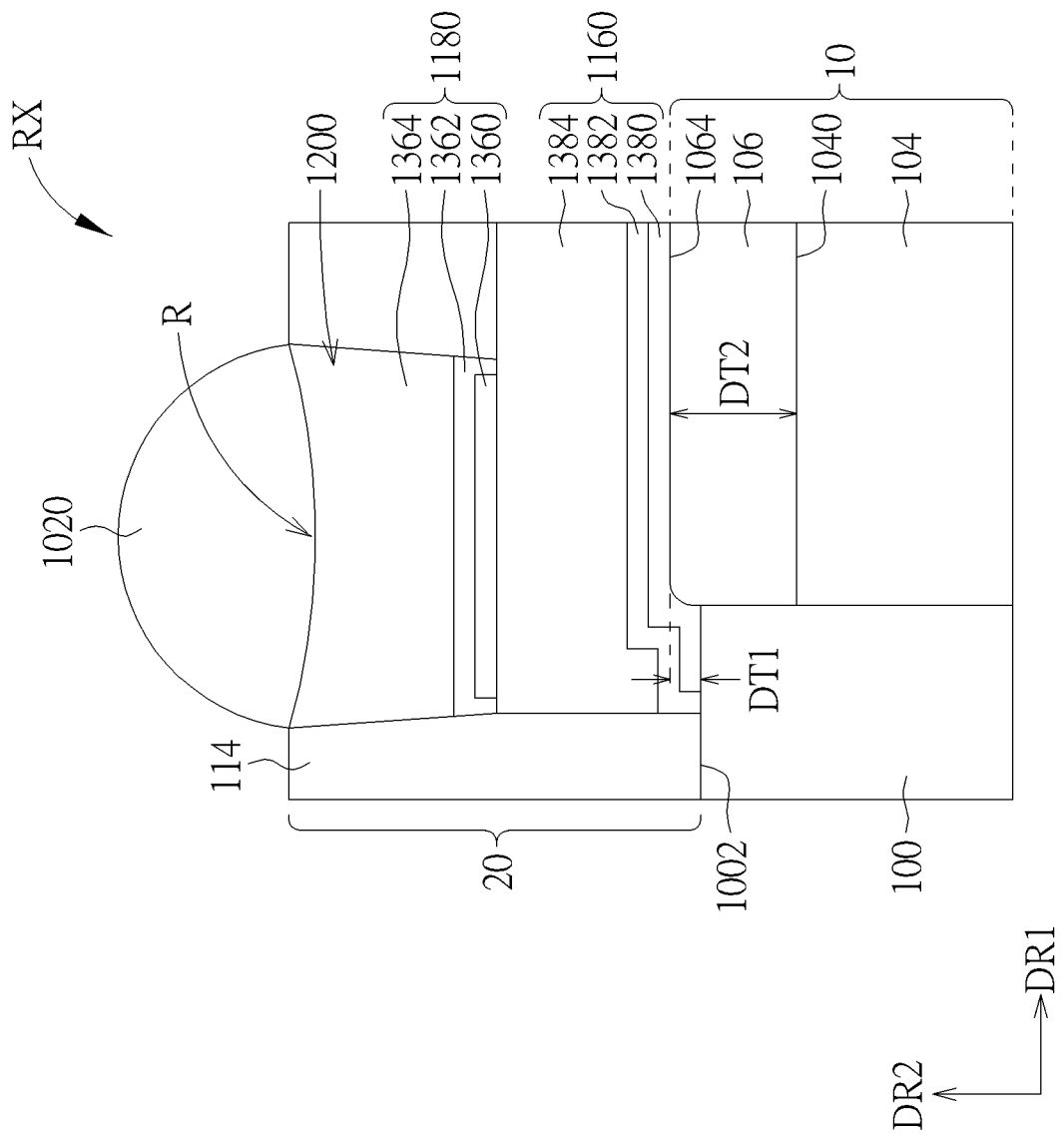
FIG. 2 is an enlarged schematic cross-sectional diagram of a region RX in FIG. 1.

Please refer to FIG. 2, FIG. 2 is an enlarged schematic cross-sectional diagram of a region RX in FIG. 1. In some embodiments, the conductor layers may include a multilayer structure, but not limited thereto. Taking the conductor layer 1180 as an example, the conductor layer 1180 may include a conductor structure 1360, a conductor structure 1362 and a conductor structure 1364, but the number of conductor structures is not limited thereto. The conductor structure 1362 can be disposed on the conductor structure 1360, and the conductor structure 1364 can be disposed between the conductor structure 1362 and the bonding pad 1020.

The length of the conductor structure 1362 projected on a horizontal plane along the direction DR2 may be greater than the length of the conductor structure 1360 projected on the horizontal plane along the direction DR2. The length of the conductor structure 1364 projected on the horizontal plane along the direction DR2 may be greater than the length of the conductor structure 1360 projected on the horizontal plane along the direction DR2.

The conductor layer 1160 may include a conductor structure 1380, a conductor structure 1382 and a conductor structure 1384, but not limited thereto. The conductor structure 1382 can be disposed on the conductor structure 1380, and the conductor structure 1384 can be disposed between the conductor structure 1382 and the conductor layer 1180. The length of the conductor structure 1384 projected on the horizontal plane along the direction DR2 may be greater than the length of the conductor structure 1380 projected on the horizontal plane along the direction DR2.

The resistivity ($\Omega$*m) of the conductor structure 1364 and the resistivity of the conductor structure 1384 may be different from the resistivity of the conductor structure 1362 and the resistivity of the conductor structure 1382, and the resistivity of the conductor structure 1362 and the resistivity of the conductor structure 1382 may be different from the resistivity of the conductor structure 1360 and the resistivity of the conductor structure 1380. For example, the resistivity of the conductor structure 1364 may be less than the resistivity of the conductor structure 1360. For example, the resistivity of the conductor structure 1364 may be greater than the resistivity of the conductor structure 1362. For example, the resistivity of the conductor structure 1362 may be less than the resistivity of the conductor structure 1360. For example, the resistivity of the conductor structure 1384 may be greater than the resistivity of the conductor structure 1380.

For example, the conductor structure 1360 and the conductor structure 1380 may include seed layers, and the material of the seed layers may include titanium, but not limited thereto. The conductor structure 1362 and the conductor structure 1382 may include seed layers, and the material of the seed layers may include copper, but not limited thereto. The conductor structure 1364 and the conductor structure 1384 may include electroplating layers, and the material of the electroplating layers may include copper, but not limited thereto.

In some embodiments, a surface 1064 of the insulating layer 106 and a surface 1002 of the encapsulation layer 100 may not be coplanar, but not limited thereto. For example, the insulating layer 106 may have a thickness DT2 in the direction DR2, a distance DT1 may be included between the surface 1064 and the surface 1002 in the direction DR2, and the distance DT1 may be about one tenth of the thickness DT2, but not limited thereto.

Since the surface 1064 and the surface 1002 may not be coplanar, a stepped structure may be formed. When other layers are formed on the insulating layer 106 and the encapsulation layer 100, this design can provide an anchoring effect. For example, it can improve the connection strength in the structure.

As shown in FIG. 1 and FIG. 2, in this embodiment, the conductor layer 1160 and the conductor layer 1164 may extend from the surface 1064 of the insulating layer 106 to the surface 1002 of the encapsulation layer 100, but not limited thereto. When the distance DT1 is about one tenth of the thickness DT2, the chances of the conductor layer 1160 and the conductor layer 1164 being broken due to the drop between the surface 1064 and the surface 1002 can be reduced. In some embodiments, the conductor layer 1160 and the conductor layer 1164 may not extend onto the surface 1002 of the encapsulation layer 100.

In some embodiments, the conductor layer 1160 and the conductor layer 1164 overlap the insulating layer 106 and the encapsulation layer 100. For example, the conductor layer 1160 and the conductor layer 1164 may extend from the surface 1064 of the insulating layer 106 to the surface 1002 of the encapsulation layer 100 along the direction DR1, and the surface 1064 of the insulating layer 106 may have an arc angle design, but not limited thereto. Since the surface of the insulating layer can have the arc angle, the risk of cracking of the conductor layer can be reduced, the contact surface area can be further increased, and the adhesion within the electronic device can be improved, but not limited thereto.

The electronic devices of the present disclosure are not limited to the aforementioned embodiments. The following will continue to disclose other embodiments of the present disclosure. However, in order to simplify the description and highlight the differences between the embodiments, the same reference numerals are used to denote the same elements hereinafter, and the repeated portions will not be described again. In addition, the features and advantages of the electronic device described above can be applied to other embodiments.

Figure 3:
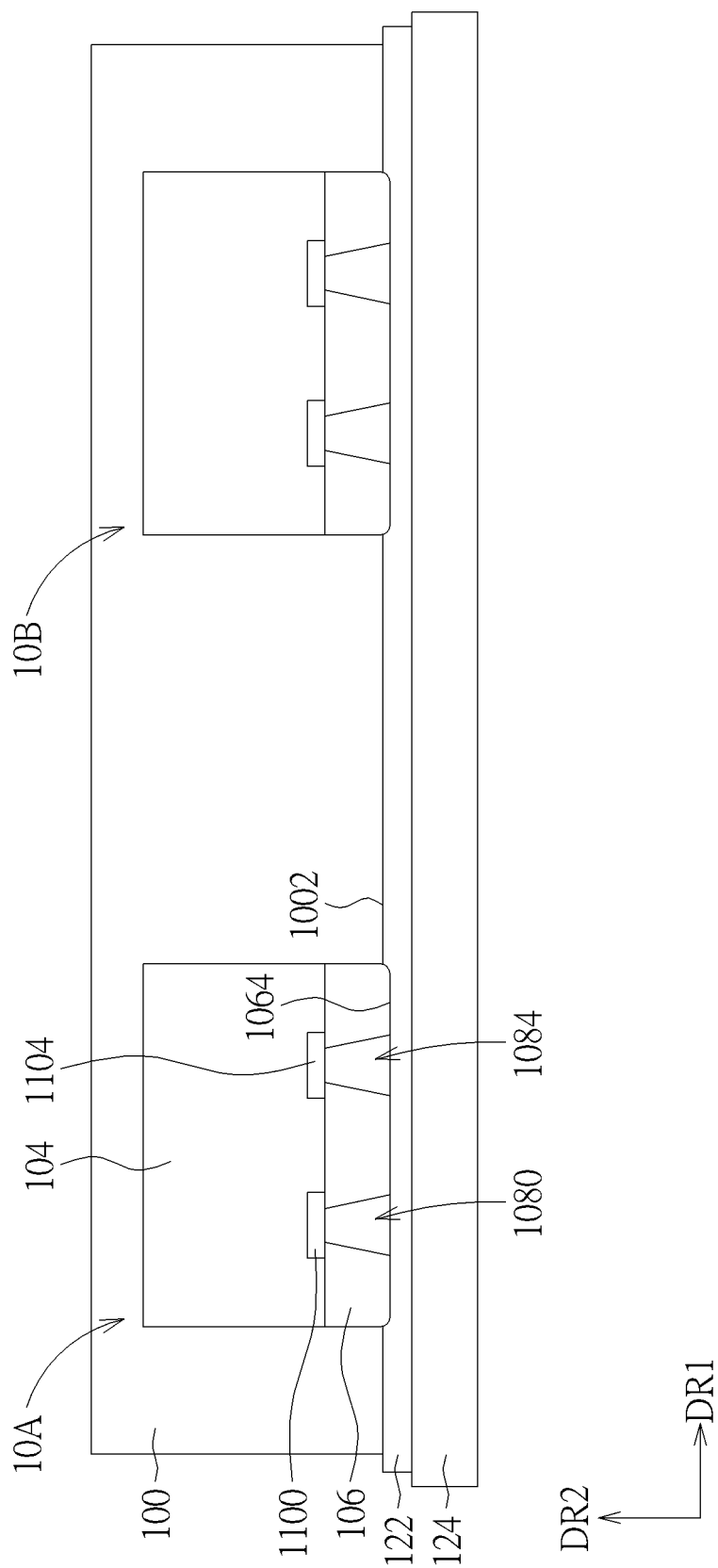
FIG. 3 to FIG. 7 are schematic cross-sectional diagrams illustrating a manufacturing method of the electronic device according to a second embodiment of the present disclosure.

Please refer to FIG. 3 to FIG. 7, FIG. 3 to FIG. 7 are schematic cross-sectional diagrams illustrating a manufacturing method of the electronic device according to a second embodiment of the present disclosure. In the step of FIG. 3, the conductive layers may not be formed in the openings 1080 and the openings 1084 of an electronic unit 10A and an electronic unit 10B, and the electronic unit 10A and the electronic unit 10B of this embodiment may not include the bonding pad 1102 and the opening 1082 in FIG. 1, but not limited thereto. The insulating layers 106 of the electronic unit 10A and the electronic unit 10B can be bonded to a carrier 124 by an adhesive layer 122.

Next, the encapsulation layer 100 can be formed on the adhesive layer 122, the electronic unit 10A and the electronic unit 10B by thermal compression molding, thermal injection molding, vacuum lamination, deposition or other suitable processes, and the encapsulation layer 100 can cover the electronic unit 10A and the electronic unit 10B.

The electronic unit 10A and the electronic unit 10B can be adhered to the adhesive layer 122 under high temperature and high pressure. The material of the insulating layer 106 may be harder than the material of the adhesive layer 122, and therefore the thickness of the adhesive layer 122 pressed by the electronic unit 10A and the electronic unit 10B may be smaller. Thus, the surface 1064 of the insulating layer 106 and the surface 1002 of the encapsulation layer 100 may not be coplanar.

Figure 4:
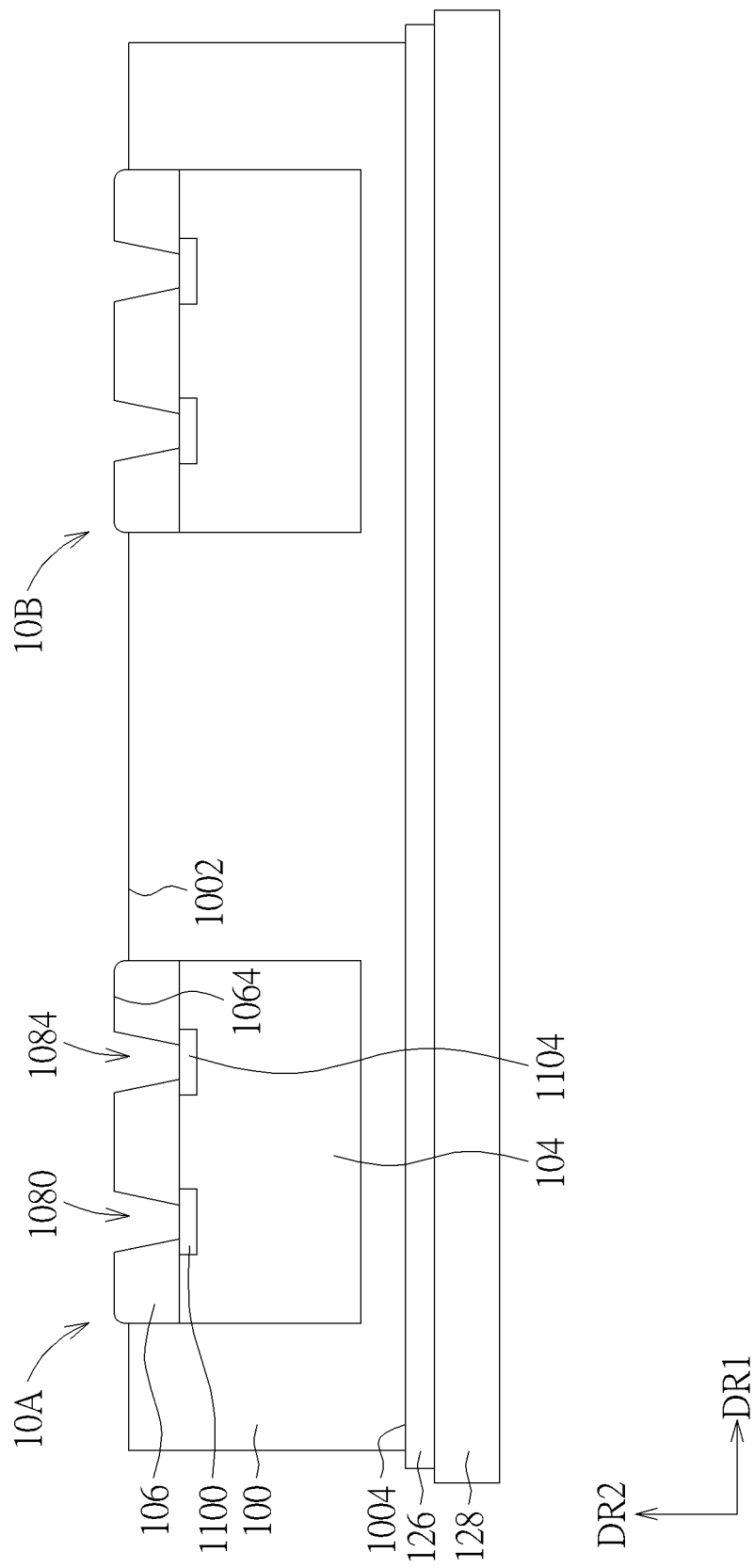

In the step of FIG. 4, the electronic unit 10A and the electronic unit 10B can be reversed, the adhesive layer 122 and the carrier 124 in FIG. 3 can be removed, and a surface 1004 of the encapsulation layer 100 can be adhered to a carrier 128 through an adhesive layer 126. The surface 1004 and the surface 1002 of the encapsulation layer 100 may be two opposite surfaces in the direction DR2. The material of the adhesive layer 122 and the adhesive layer 126 may include acrylate adhesive, polyurethane (PU), silicon adhesive or other suitable materials, but not limited thereto. The material of the carrier 124 and the carrier 128 may include glass, stainless steel, carbon fiber resin, glass fiber resin or other suitable materials, but not limited thereto.

Figure 5:
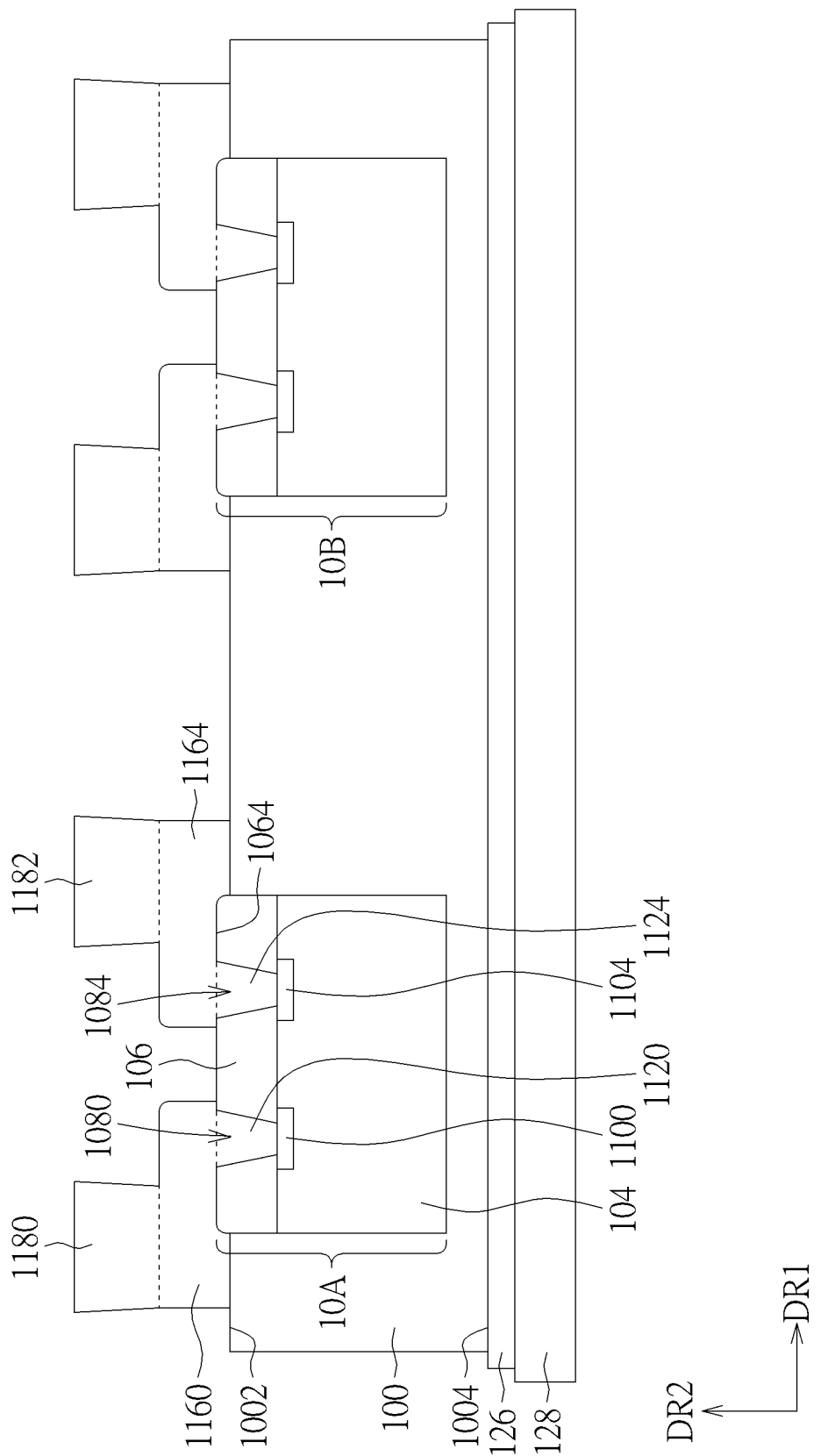

In the step of FIG. 5, the conductor layer 1120 and the conductor layer 1124 may be formed in the opening 1080 and the opening 1084, the conductor layer 1160 and the conductor layer 1164 may be formed on the conductor layer 1120 and the conductor layer 1124, and the conductor layer 1180 and the conductor layer 1182 may be formed on the conductor layer 1160 and the conductor layer 1164.

For example, the conductor layer 1120 and the conductor layer 1124 can be formed by the photolithography and etching process, the conductor layer 1160 and the conductor layer 1164 can be formed by another photolithography and etching process, and the conductor layer 1180 and the conductor layer 1182 can be formed by still another photolithography and etching process, but not limited thereto. In other words, the conductor layers on the same level can be formed by the same photolithography and etching process, but not limited thereto.

In some embodiments (as shown in FIG. 5 to FIG. 9), the top surface of the conductor layer 1180 and the top surface of the conductor layer 1182 may be flat and without recesses after fabrication, but not limited thereto. In other embodiments (as shown in FIG. 1 and FIG. 2), the top surface of the conductor layer 1180 and the top surface of the conductor layer 1182 may have recesses R after fabrication, but not limited thereto.

Figure 8:
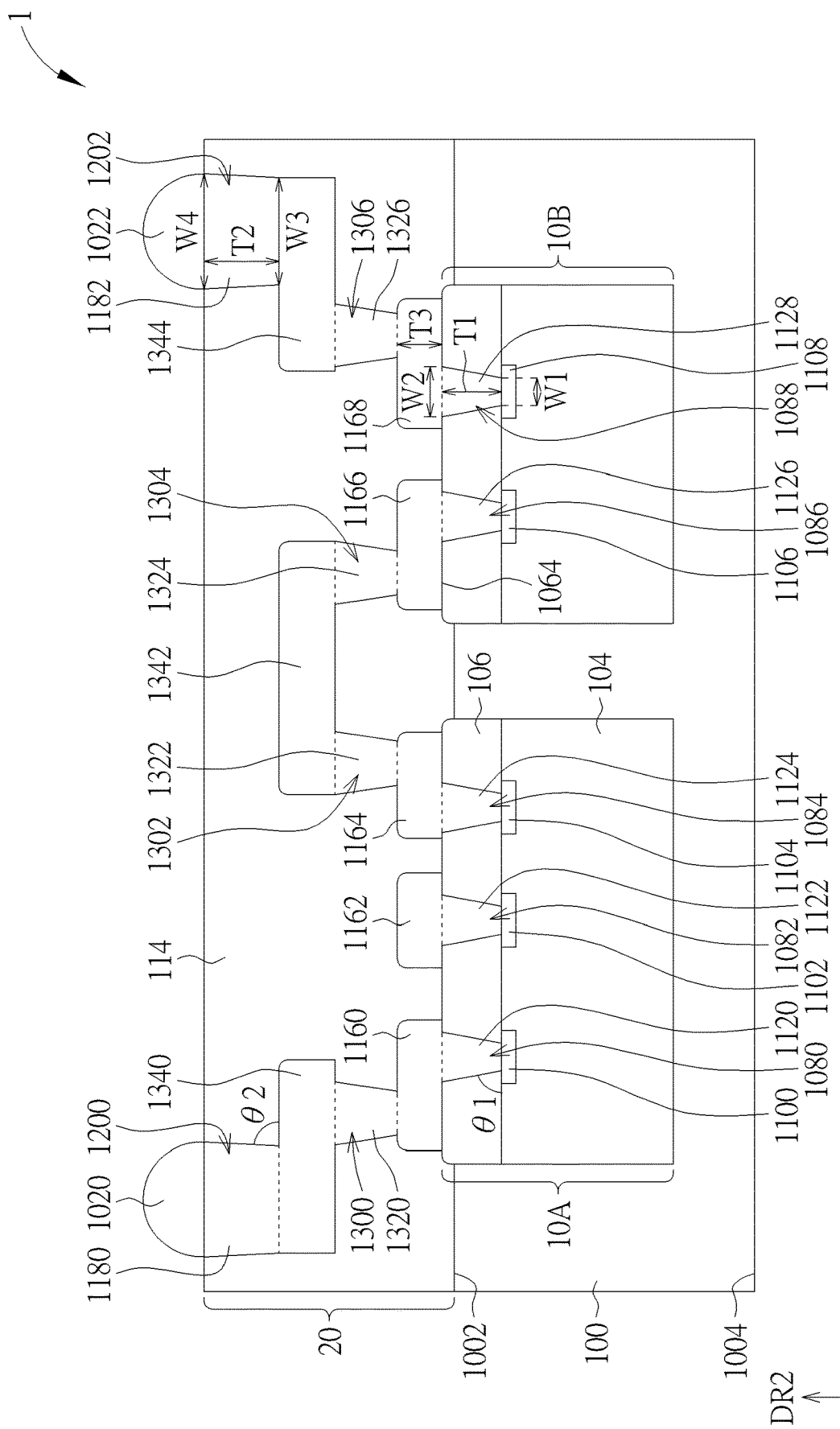
FIG. 8 is a schematic cross-sectional diagram illustrating an electronic device according to a third embodiment of the present disclosure.
Figure 9:
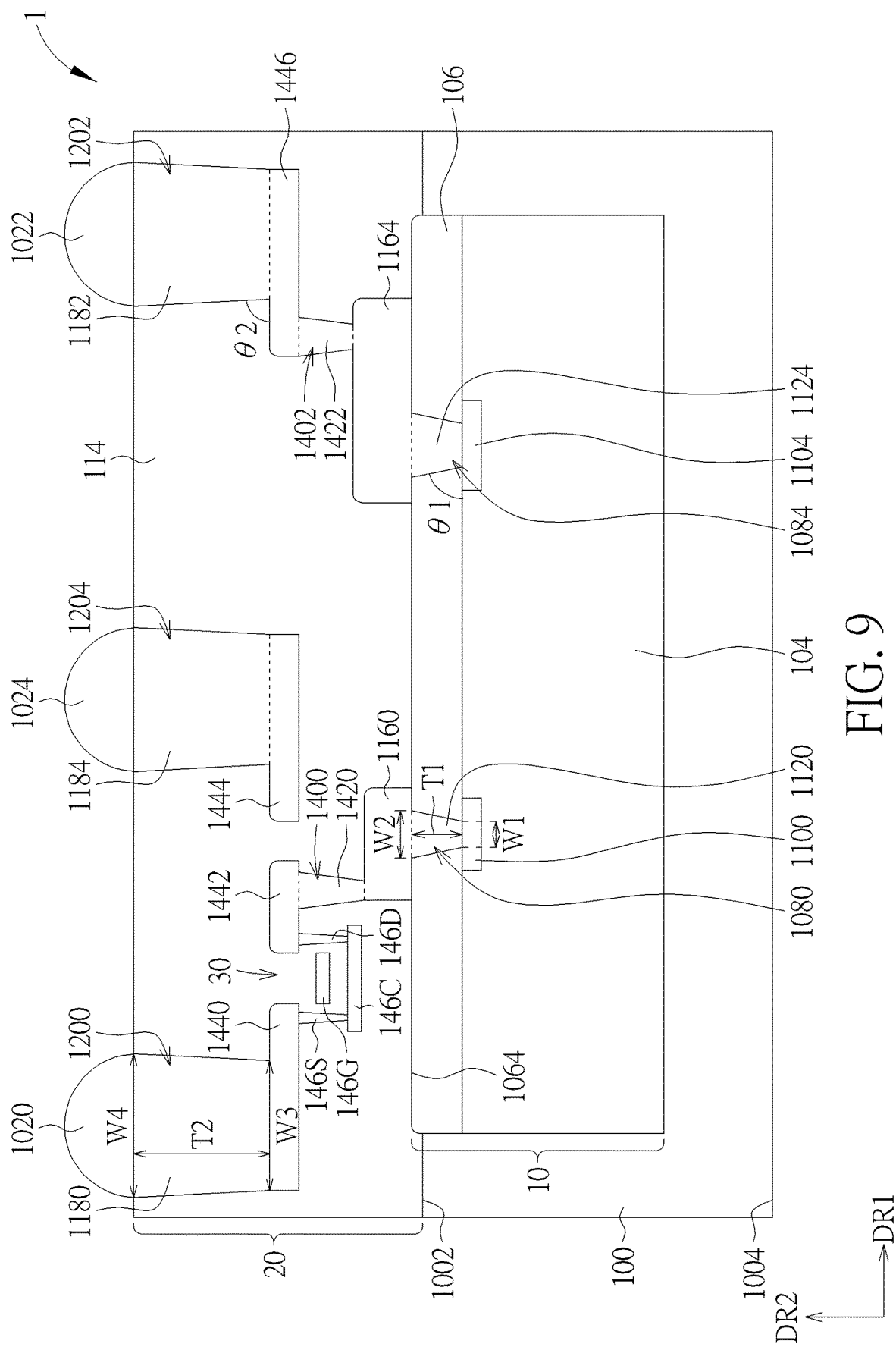
FIG. 9 is a schematic cross-sectional diagram illustrating an electronic device according to a fourth embodiment of the present disclosure.

In addition, the number of the conductor layers in the circuit layer 20 of the present disclosure can be altered according to different designs, and multiple stacked conductor layers can be formed by repeating photolithography and etching processes, as shown in FIG. 8 and FIG. 9.

Figure 6:
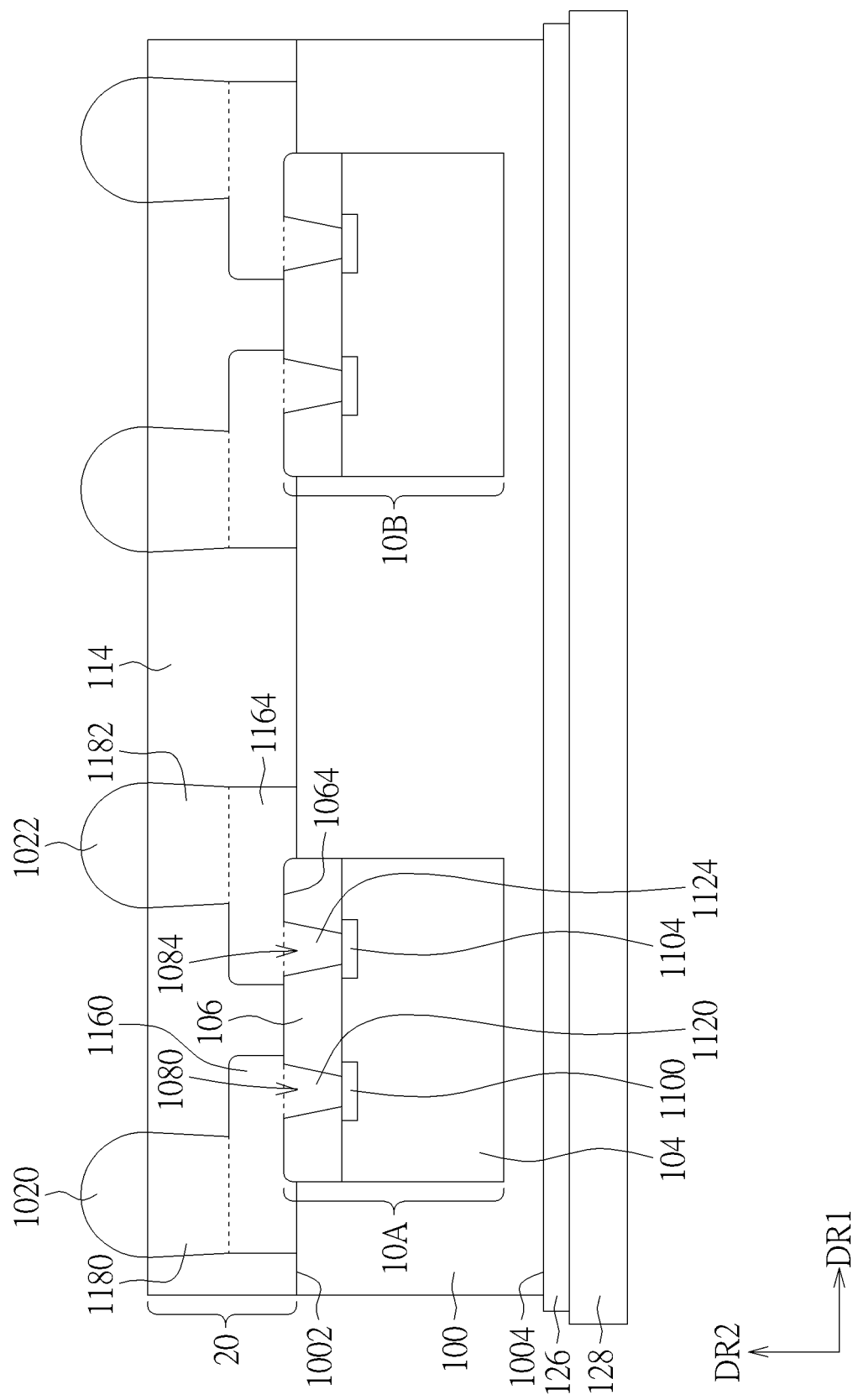
Figure 7:
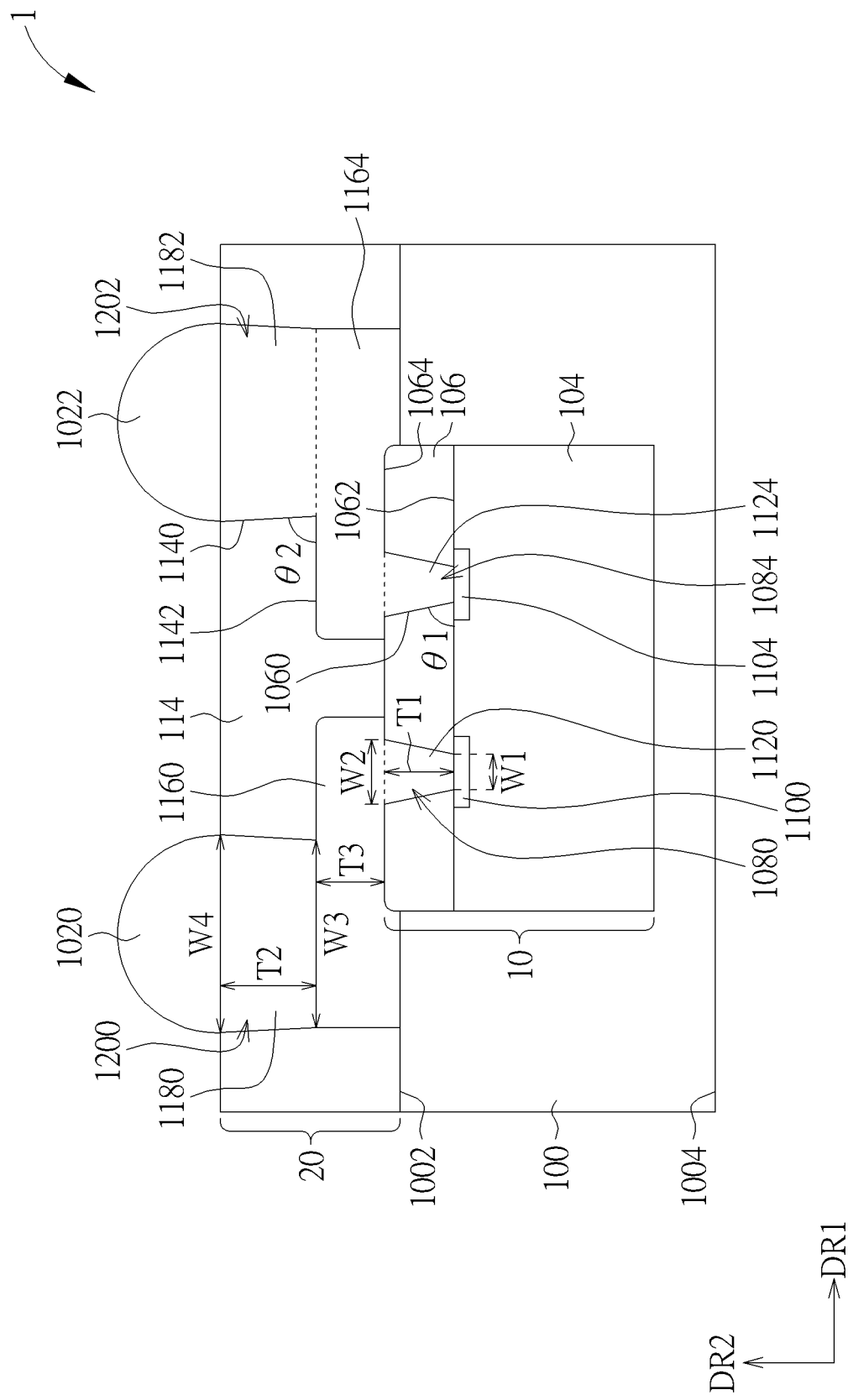

In the step of FIG. 6, the insulating layer 114 can be formed on the electronic unit 10A, the electronic unit 10B and the encapsulation layer 100. For example, the insulating layer 114 can be formed by a deposition process, the insulating layer 114 can fill the space between the conductor layers and cover the conductor layer 1180 and the conductor layer 1182, and the excess insulating layer 114 can be removed by a grinding process to expose the top surfaces of the conductor layer 1180 and the conductor layer 1182, but not limited thereto.

In addition, the bonding pad 1020 and the bonding pad 1022 can be formed on the conductor layer 1180 and the conductor layer 1182 of the circuit layer 20. Next, a cutting process can be performed to separate the electronic unit 10A and the electronic unit 10B, and the adhesive layer 126 and the carrier 128 can be removed to obtain the electronic device 1 of FIG. 7.

Please refer to FIG. 8, FIG. 8 is a schematic cross-sectional diagram illustrating an electronic device according to a third embodiment of the present disclosure. Different from the first embodiment, the electronic device 1 of this embodiment may include the electronic unit 10A and the electronic unit 10B electrically connected to each other. The electronic unit 10A may include the conductor layer 1120, the conductor layer 1122 and the conductor layer 1124. The insulating layer 106 of the electronic unit 10A may include the opening 1080, the opening 1082 and the opening 1084, and the conductor layer 1120, the conductor layer 1122 and the conductor layer 1124 may respectively be disposed in the opening 1080, the opening 1082 and the opening 1084.

The electronic unit 10B may include a conductor layer 1126 and a conductor layer 1128. The insulating layer 106 of the electronic unit 10B may include an opening 1086 and an opening 1088. The conductor layer 1126 may be disposed in the opening 1086 and electrically connected to a bonding pad 1106, and the conductor layer 1128 may be disposed in the opening 1088 and electrically connected to a bonding pad 1108.

The circuit 20 may include the conductor layer 1160, the conductor layer 1162, the conductor layer 1164, a conductor layer 1166 and a conductor layer 1168, and the above conductor layers may respectively be disposed on the conductor layer 1120, the conductor layer 1122, the conductor layer 1124, the conductor layer 1126 and the conductor layer 1128. The conductor layer 1160, the conductor layer 1162, the conductor layer 1164, the conductor layer 1166 and the conductor layer 1168 may respectively be electrically connected to the conductor layer 1120, the conductor layer 1122, the conductor layer 1124, the conductor layer 1126 and the conductor layer 1128. In addition, the conductor layer 1160, the conductor layer 1164, the conductor layer 1166 and the conductor layer 1168 may not extend onto the surface 1002 of the encapsulation layer 100.

In this embodiment, the circuit layer 20 may include an opening 1300, an opening 1302, an opening 1304, an opening 1306, a conductor layer 1320, a conductor layer 1322, a conductor layer 1324 and a conductor layer 1326. The opening 1300, the opening 1302, the opening 1304, and the opening 1306 may be disposed in the insulating layer 114. The opening 1300 may be disposed on the conductor layer 1160 and may expose a portion of the surface of the conductor layer 1160. The opening 1302 may be disposed on the conductor layer 1164 and may expose a portion of the surface of the conductor layer 1164. The opening 1304 may be disposed on the conductor layer 1166 and may expose a portion of the surface of the conductor layer 1166. The opening 1306 may be disposed on the conductor layer 1168 and may expose a portion of the surface of the conductor layer 1168.

The conductor layer 1320, the conductor layer 1322, the conductor layer 1324 and the conductor layer 1326 can respectively be disposed in the opening 1300, the opening 1302, the opening 1304 and the opening 1306. The conductor layer 1320, the conductor layer 1322, the conductor layer 1324 and the conductor layer 1326 can respectively be electrically connected to the conductor layer 1160, the conductor layer 1164, the conductor layer 1166 and the conductor layer 1168.

In this embodiment, the circuit layer 20 may include a conductor layer 1340, a conductor layer 1342 and a conductor layer 1344. The conductor layer 1340 and the conductor layer 1344 can respectively be disposed on the conductor layer 1320 and the conductor layer 1326. The conductor layer 1340 and the conductor layer 1344 can respectively be electrically connected to the conductor layer 1320 and the conductor layer 1326.

The conductor layer 1342 can be disposed on the conductor layer 1322 and the conductor layer 1324. One end of the conductor layer 1342 can be connected to the conductor layer 1322, the other end of the conductor layer 1342 can be connected to the conductor layer 1324, the conductor layer 1342 can be electrically connected to the conductor layer 1322 and the conductor layer 1324, thus the electronic unit 10A and the electronic unit 10B can be electrically connected to each other.

The opening 1200 and the conductor layer 1180 may be disposed between the conductor layer 1340 and the bonding pad 1020. The opening 1200 may expose a portion of the surface of the conductor layer 1340. The bonding pad 1020, the conductor layer 1180 and the conductor layer 1340 may be electrically connected to each other, and the bonding pad 1020 may be electrically connected to the electronic unit 10A.

The opening 1202 and the conductor layer 1182 may be disposed between the conductor layer 1344 and the bonding pad 1022. The opening 1202 may expose a portion of the surface of the conductor layer 1344. The bonding pad 1022, the conductor layer 1182 and the conductor layer 1344 may be electrically connected to each other, and the bonding pad 1022 may be electrically connected to the electronic unit 10B.

In addition, in this embodiment, the included angle θ2 may be included between a sidewall of the conductor layer 1180 and a top surface of the conductor layer 1340 or included between a sidewall of the conductor layer 1182 and a top surface of the conductor layer 1344, but not limited thereto.

Please refer to FIG. 9, FIG. 9 is a schematic cross-sectional diagram illustrating an electronic device according to a fourth embodiment of the present disclosure. In this embodiment, the electronic unit 10 may include the conductor layer 1120 and the conductor layer 1124, the insulating layer 106 of the electronic unit 10 may include the opening 1080 and the opening 1084, and the conductor layer 1120 and the conductor layer 1124 may respectively be disposed in the opening 1080 and the opening 1084.

The circuit layer 20 may include the conductor layer 1160 and the conductor layer 1164 respectively disposed on the conductor layer 1120 and the conductor layer 1124. The conductor layer 1160 and the conductor layer 1164 may respectively be electrically connected to the conductor layer 1120 and the conductor layer 1124. In addition, the conductor layer 1160 and the conductor layer 1164 may not extend onto the surface 1002 of the encapsulation layer 100.

In this embodiment, the circuit layer 20 may include an opening 1400, an opening 1402, a conductor layer 1420 and a conductor layer 1422. The opening 1400 and the opening 1402 may be disposed in the insulating layer 114 and respectively disposed on the conductor layer 1160 and the conductor layer 1164. The opening 1400 may be disposed on the conductor layer 1160 and may expose a portion of the surface of the conductor layer 1160, and the opening 1402 may be disposed on the conductor layer 1164 and may expose a portion of the surface of the conductor layer 1164.

The conductor layer 1420 and the conductor layer 1422 may respectively be disposed in the opening 1400 and the opening 1402, and the conductor layer 1420 and the conductor layer 1422 may respectively be electrically connected to the conductor layer 1160 and the conductor layer 1164. The conductor layer 1420 may be directly in contact with the conductor layer 1160, and the conductor layer 1422 may be directly in contact with the conductor layer 1164, but not limited thereto.

In this embodiment, the circuit layer 20 may include a conductor layer 1440, a conductor layer 1442, a conductor layer 1444 and a conductor layer 1446. The conductor layer 1442 and the conductor layer 1446 may respectively be disposed on the conductor layer 1420 and the conductor layer 1422. The conductor layer 1442 and the conductor layer 1446 may respectively be electrically connected to the conductor layer 1420 and the conductor layer 1422. The conductor layer 1442 may be directly in contact with the conductor layer 1420, and the conductor layer 1446 may be directly in contact with the conductor layer 1422, but not limited thereto.

The opening 1200 and the conductor layer 1180 may be disposed between the conductor layer 1440 and the bonding pad 1020, the opening 1200 may expose a portion of the surface of the conductor layer 1440, and the bonding pad 1020, the conductor layer 1180 and the conductor layer 1440 may be electrically connected to each other. The opening 1202 and the conductor layer 1182 may be disposed between the conductor layer 1446 and the bonding pad 1022, the opening 1202 may expose a portion of the surface of the conductor layer 1446, and the bonding pad 1022, the conductor layer 1182 and the conductor layer 1446 may be electrically connected to each other.

In this embodiment, the circuit layer 20 may further include an opening 1204 and a conductor layer 1184, and the electronic device 1 may further include a bonding pad 1024. The opening 1204 may be disposed in the insulating layer 114 and on the conductor layer 1444, the opening 1204 may expose a portion of the surface of the conductor layer 1444, the conductor layer 1184 may be disposed in the opening 1204, and the bonding pad 1024 may be disposed on the conductor layer 1184. The bonding pad 1024, the conductor layer 1184 and the conductor layer 1444 may be electrically connected to each other.

In addition, in this embodiment, the included angle θ2 may be included between a sidewall of the conductor layer 1182 and a top surface of the conductor layer 1446, or the included angle θ2 may be included between a sidewall of the conductor layer 1180 and a top surface of the conductor layer 1440, or the included angle θ2 may be included between a sidewall of the conductor layer 1184 and a top surface of the conductor layer 1444, but not limited thereto.

Different from the first embodiment, the electronic device 1 of this embodiment may include an electronic component 30 disposed in the circuit layer 20. The electronic component 30 may include an active component, a passive component or a combination of the above. For example, the electronic component 30 in FIG. 9 may be the active component, such as a thin film transistor, but not limited thereto.

The electronic component 30 may be electrically connected to the conductor layer 1160 and the conductor layer 1180. The electronic component 30 may include a gate 146G, a source 146S, a drain 146D and a semiconductor layer 146C, but not limited thereto. The source 146S may be electrically connected to the conductor layer 1440 and the semiconductor layer 146C, thus the bonding pad 1020 may be electrically connected to the source 146S of the electronic component 30. The drain 146D may be electrically connected to the conductor layer 1442 and the semiconductor layer 146C, thus the electronic component 30 may be electrically connected to the electronic unit 10. In addition, the gate 146G may be electrically connected to the conductor layer 1444 (not shown), thus the bonding pad 1024 may be electrically connected to the gate 146G of the electronic component 30. However, the design of the electronic component 30 of the present disclosure is not limited to the above.

To sum up, in the electronic device of the present disclosure, the height of the first conductor layer in the insulating layer of the electronic unit may be less than the height of the second conductor layer disposed outermost in the circuit layer used for connecting the bonding pad. The heat generated by the chip can be conducted to the external conductor layer through a short distance and in a short time, and the heat accumulated in the conductor layers closest to the chip can be reduced. Therefore, the heat dissipation effect of the electronic device can be improved, and the probability that the performance of the electronic device is lowered due to high temperature can be reduced. When the ratio of the bottom width to the top width of the second conductor layer may be greater than 0.7 and less than 1.2, this ratio can be greater than the ratio of the bottom width to the top width of the first conductor layer. Under this condition, the second conductor layer can have a shape close to a straight cylinder and can improve the efficiency of signal transmission.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   an electronic unit, comprising:
     a chip;
     an insulating layer disposed on the chip, wherein the insulating layer comprises a first opening, a surface and a side surface connecting the surface; and
     a first conductor layer disposed in the first opening;
   a circuit layer disposed corresponding to the electronic unit, wherein the circuit layer comprises a second opening and a second conductor layer disposed in the second opening;
   a bonding pad being in contact with the second conductor layer, wherein the bonding pad is electrically connected to the electronic unit; and
   an encapsulation layer surrounding the electronic unit, wherein a third conductor layer of the circuit layer overlaps the insulating layer and the encapsulation layer,
   wherein the first conductor layer has a first height, the second conductor layer has a second height, and a ratio of the first height to the second height is greater than or equal to 0.1 and less than or equal to 0.9,
   wherein the third conductor layer is in contact with at least a portion of the surface and at least a portion of the side surface of the insulating layer, and the third conductor layer is in contact with a surface of the encapsulation layer.

2. The electronic device according to claim 1, wherein the second conductor layer has a top width, and a ratio of the second height to the top width is greater than or equal to 0.2 and less than or equal to 0.5.

3. The electronic device according to claim 1, wherein the first conductor layer has a top width and a bottom width, and a ratio of the bottom width to the top width is greater than 0.3 and less than 0.8.

4. The electronic device according to claim 1, wherein the second conductor layer comprises:
   a first conductor structure;
   a second conductor structure disposed on the first conductor structure; and
   a third conductor structure disposed between the second conductor structure and the bonding pad,
   wherein a resistivity of the third conductor structure is greater than a resistivity of the second conductor structure, and the resistivity of the second conductor structure is different from a resistivity of the first conductor structure.

5. The electronic device according to claim 4, wherein the resistivity of the second conductor structure is less than the resistivity of the first conductor structure.

6. The electronic device according to claim 1, wherein the second conductor layer has a top width and a bottom width, and a ratio of the bottom width to the top width is greater than 0.7 and less than 1.2.

7. The electronic device according to claim 1, wherein the first conductor layer has a first top width and a first bottom width, the second conductor layer has a second top width and a second bottom width, and a first ratio of the first bottom width to the first top width is less than a second ratio of the second bottom width to the second top width.

8. The electronic device according to claim 1, wherein the first conductor layer has a bottom width, and a ratio of the first height to the bottom width is greater than or equal to 1 and less than or equal to 4.5.

9. The electronic device according to claim 1, wherein the third conductor layer is disposed between the first conductor layer and the second conductor layer, and the third conductor layer is electrically connected to the first conductor layer and the second conductor layer.

10. The electronic device according to claim 9, wherein the third conductor layer has a third height, and the third height is greater than or equal to the first height.

11. The electronic device according to claim 9, wherein the first conductor layer includes a first sidewall, the insulating layer includes a bottom surface, a first included angle is included between the first sidewall of the first conductor layer and the bottom surface of the insulating layer, the second conductor layer includes a second sidewall, the third conductor layer includes a top surface, a second included angle is included between the second sidewall of the second conductor layer and the top surface of the third conductor layer, and the first included angle is less than the second included angle.

12. The electronic device according to claim 1, wherein the surface of the insulating layer and a surface of the encapsulation layer is not coplanar.

13. The electronic device according to claim 12, wherein the insulating layer has a thickness, a distance is included between the surface of the insulating layer and the surface of the encapsulation layer, and the distance is one tenth of the thickness.

14. The electronic device according to claim 1, wherein the bonding pad is in contact with a top surface of the second conductor layer, and the top surface of the second conductor layer has a recess.

15. The electronic device according to claim 1, wherein the bonding pad is in contact with a top surface of the second conductor layer, and the top surface of the second conductor layer is a flat surface.

16. The electronic device according to claim 1, wherein the chip comprises a bonding pad, the first opening and the first conductor layer are disposed on the bonding pad of the chip, and the first conductor layer is electrically connected to the bonding pad of the chip.

17. The electronic device according to claim 1, further comprising an electronic component disposed in the circuit layer, and the electronic component comprises an active component or a passive component.

18. The electronic device according to claim 17, wherein the electronic component is the active component, and the electronic component is electrically connected to the first conductor layer and the second conductor layer.

* * * * *